United States Patent
Sano et al.

(10) Patent No.: US 8,218,917 B2
(45) Date of Patent: Jul. 10, 2012

(54) PACKAGE MANUFACTURING METHOD, PACKAGE, OPTICAL MODULE AND DIE FOR INTEGRAL MOLDING

(75) Inventors: Akihiko Sano, Uji (JP); Hiroto Nozawa, Yokohama (JP); Naru Yasuda, Uji (JP); Hayami Hosokawa, Kyoto (JP)

(73) Assignee: OMRON Corporation, Kyoto (JP)

( * ) Notice: Subject to any disclaimer, the term of this patent is extended or adjusted under 35 U.S.C. 154(b) by 393 days.

(21) Appl. No.: 12/530,247

(22) PCT Filed: Mar. 7, 2008

(86) PCT No.: PCT/JP2008/054188
§ 371 (c)(1),
(2), (4) Date: Oct. 28, 2009

(87) PCT Pub. No.: WO2008/111524
PCT Pub. Date: Sep. 18, 2008

(65) Prior Publication Data
US 2010/0104240 A1    Apr. 29, 2010

(30) Foreign Application Priority Data
Mar. 9, 2007    (JP) .................................. 2007-061044

(51) Int. Cl.
*G02B 6/12* (2006.01)
*G02B 6/255* (2006.01)
*B28B 23/18* (2006.01)

(52) U.S. Cl. ........... 385/14; 385/92; 385/129; 264/1.25; 425/108

(58) Field of Classification Search ............... 385/88, 385/89, 92, 94, 14, 129, 130, 131; 264/1.1, 264/1.24, 1.25, 2.4, 2.7; 425/108
See application file for complete search history.

(56) References Cited

U.S. PATENT DOCUMENTS

| | | | | | |
|---|---|---|---|---|---|
| 4,410,469 | A | * | 10/1983 | Katagiri et al. | 264/1.25 |
| 5,099,307 | A | * | 3/1992 | Go et al. | 29/841 |
| 5,127,071 | A | * | 6/1992 | Go | 385/73 |
| 5,537,737 | A | * | 7/1996 | Kamakura et al. | 29/827 |
| 2010/0104240 | A1 | * | 4/2010 | Sano et al. | 385/14 |

FOREIGN PATENT DOCUMENTS

| | | |
|---|---|---|
| JP | 6-151699 A | 5/1994 |
| JP | 11-111746 A | 4/1999 |
| JP | 11-287926 A | 10/1999 |

OTHER PUBLICATIONS

International Search Report w/translation from PCT/JP2008/054188 dated May 1, 2008 (2 pages).
espacenet.com Abstract; Publication No. JP11287926A dated Oct. 19, 1999; Nippon Telegraph & Telephone Corp. (1 page).

(Continued)

*Primary Examiner* — Brian Healy
(74) *Attorney, Agent, or Firm* — Osha • Liang LLP

(57) ABSTRACT

An integrally molding die for manufacturing a package includes a supporting portion for supporting at least one end including an incident/exit port of a light signal in a light transmission path, and a lead frame for mounting an optical element. The integrally molding die includes a recess for forming the supporting portion, a first projection, which comes into contact with an optical element mounting surface of the lead frame, and a second projection, which comes into contact with a back surface of the optical element mounting surface.

8 Claims, 7 Drawing Sheets

OTHER PUBLICATIONS espacenet.com Abstract; Publication No. JP11111746A dated Apr. 23, 1999; Miyazaki Oki Denki KK; Oki Electric Ind. Co. Ltd. (1 page).

espacenet.com Abstract; Publication No. JP6151699A dated May 31, 1994; Fuji Electric Co. Ltd. (1 page).

* cited by examiner

PACKAGE MANUFACTURING METHOD, PACKAGE, OPTICAL MODULE AND DIE FOR INTEGRAL MOLDING

TECHNICAL FIELD

The present invention relates to a method of manufacturing a package, a package, an optical module, and an integrally molding die.

BACKGROUND ART

In recent years, optical communication network enabling large capacity data communication at high speed is expanding. The optical communication network is assumed to be mounted on a consumer device in the future. An electrical input/output optical data transmission cable (optical cable) capable of being used no different from the present electrical cable is desired for the application of large capacity data transfer at higher speed, noise countermeasures, and data transmission between substrates in the device. In view of flexibility, a light guide is desirably used for the optical cable. A light transmission path will be described below as the light guide, but includes light transmission paths such as an optical fiber.

The light guide is formed by a core having a large index of refraction and a clad having a small index of refraction arranged in contact with the periphery of the core, and propagates the light signal entered to the core while repeating total-reflection at the boundary of the core and the clad. The flexibility can be enhanced by using a flexible polymer material for the core and the clad of the light guide.

In recent years, in particular, a flexible (similar to electrical wiring) optical wiring mounted on bendable displays and smaller and thinner consumer devices is desirably realized with the light guide. That is, the light guide is desirably a film-form light guide.

The photoelectric conversion elements (optical elements) need to be aligned and optically coupled to transmit the optical data using the light guide. The optical element converts an electrical signal to a light signal and emits the same, or receives a light signal and converts the same to an electrical signal. In order to maintain such an optically coupled state, the distance and the positional relationship of a light receiving/transmitting unit of the light signal in the optical element fixed with the optical cable and the incident/exit port of the light signal in the light guide need to be maintained constant.

In a package mounted with the flexible light guide and the optical element, a manufacturing method of a package capable of realizing the positional accuracy of the flexible light guide end and the optical element is desired. Generally, the package includes an accommodating portion for accommodating the optical element and a supporting portion for supporting the flexible light guide. A lead frame connecting with the optical element is arranged in the package.

Patent Document 1 discloses a manufacturing method of a semiconductor device, where in such a manufacturing method, a lead frame mounted with an IC chip is set in the die, and resin sealing is performed with the four corners of a die pad held down with upper and lower movable pins.

Patent Document 2 discloses a manufacturing method of a semiconductor device, where a lower surface electrode of a silicon surge absorber chip is fixed on a copper substrate using a solder, the head of the lead frame is soldered to an upper electrode of the chip, and the chip is covered by molding resin so as to expose part of the substrate.

However, the techniques disclosed in Patent Documents 1 and 2 have the following problems when applied to the manufacturing method of the package mounted with the light transmission path and the optical element.

First, in Patent Document 1, resin sealing is performed with the four corners of the die held down with the upper and lower movable pins. A warp etc. produces at the lead frame (die pad mounting surface) immediately below the die pad if the four corners of the die pad are simply held down. In a normal semiconductor device, the warp etc. of the die pad mounting surface does not influence the operation of the semiconductor device. In the package mounted with the flexible light transmission path and the optical element, however, high accuracy is demanded on the positional relationship of the flexible light transmission path end and the optical element. In particular, a package in which the positional accuracy of the light guide mounting surface and the optical element mounting surface is high is necessary. Thus, the warp tends to easily produce at the optical element mounting surface, and manufacturing at the demanded positional accuracy becomes difficult even if the technique disclosed in Patent Document 1 is applied and the package is manufactured with the four portions of the optical element mounting surface in the lead frame held down with the upper and lower movable pins.

In the semiconductor device of Patent Document 2, since the chip mounting portion is held with one side of the substrate, the positional accuracy with the mold resin is difficult.

Patent Document 1: Japanese Laid-Open Patent Publication "Japanese Laid-Open Patent Publication No. 11-111746 (date of publication: Apr. 23, 1999).

Patent Document 2: Japanese Laid-Open Patent Publication "Japanese Laid-Open Patent Publication No. 6-151699 (date of publication: May 31, 1994).

DISCLOSURE OF THE INVENTION

In view of the above problems, it is an object of the present invention to provide a manufacturing method of a package, a package, an optical module, and an integrally molding die capable of satisfying a positional accuracy demanded to maintain the positional relationship of the flexible light transmission path end and the optical element constant.

In order to achieve the above object, a manufacturing method of a package according to the present invention is directed to a manufacturing method of a package including a supporting portion for supporting at least one end including an incident/exit port of a light signal in a light transmission path and a lead frame for mounting an optical element; the manufacturing method including an integral molding step of setting the lead frame in a die including a recess for forming the supporting portion, a first projection, which comes into contact with an optical element mounting surface of the lead frame, and a second projection, which comes into contact with a back surface of the optical element mounting surface, filling resin to the die, and integrally molding the package.

According to the above configuration, the die including the recess for forming the supporting portion, the first projection, which comes into contact with the optical element mounting surface of the lead frame, and the second projection, which comes into contact with the back surface of the optical element mounting surface, is used for integral molding, and thus the first projection and the second projection come into contact with both surfaces, the optical element mounting surface and the back surface, respectively, so as to sandwich the optical element mounting portion of the lead frame when the lead frame is set in the die. Thus, when the lead frame is set in the die, the optical element mounting surface of the lead frame does not produce warp etc., and becomes a flat surface. Therefore, the package manufactured through integral molding with the die can prevent warp of the optical element mounting surface in the lead frame, and satisfy the positional accuracy required to maintain the positional relationship of the flexible light transmission path end and the optical element constant.

To achieve the above object, the package according to the present invention is manufactured through the above-described manufacturing method of the package.

Accordingly, there can be realized a package that can prevent the warp of the optical element mounting surface in the lead frame, and satisfy the positional accuracy required to maintain the positional relationship of the flexible light transmission path end and the optical element constant.

To achieve the above object, in an optical module according to the present invention, an optical element and a light transmission path are mounted on the package.

Accordingly, an optical module capable of satisfying the positional accuracy required to maintain the positional relationship of the flexible light transmission path end and the optical element constant can be realized.

To achieve the above object, an integrally molding die according to the present invention is directed to an integrally molding die for manufacturing a package including a supporting portion for supporting at least one end including an incident/exit port of a light signal in a light transmission path and a lead frame for mounting an optical element; the integrally molding die having:

a recess for forming the supporting portion, a first projection, which comes into contact with an optical element mounting surface of the lead frame, and a second projection, which comes into contact with a back surface of the optical element mounting surface.

Through the use of the integral molding die having the above configuration, a package satisfying the positional accuracy required to maintain the positional relationship of the flexible light transmission path end and the optical element constant can be manufactured.

Further objects, features, and advantages of the present invention will become more apparent from the following description.

BEST MODE FOR CARRYING OUT THE INVENTION

One embodiment of the present invention will be hereinafter described based on the drawings.
(Configuration of Optical Module)

Figure 2:
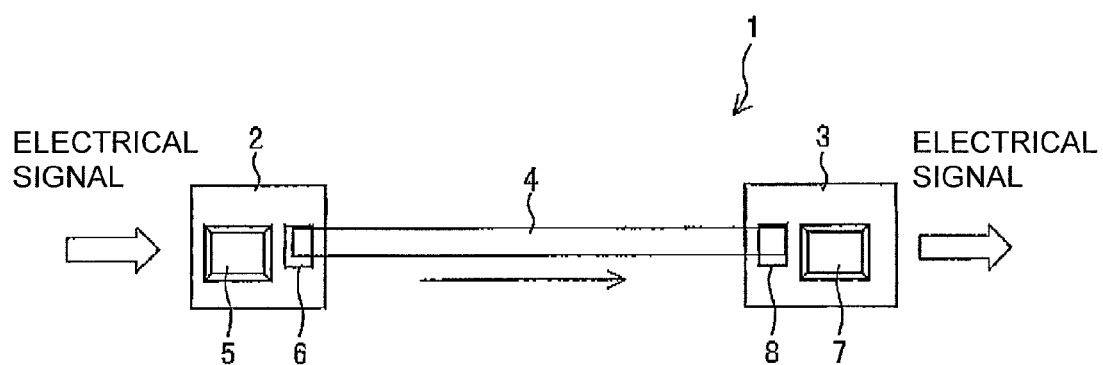
FIG. 2 is a view showing a schematic configuration of a light transmission module according to the present embodiment.

FIG. 2 shows a schematic configuration of an optical module 1 according to the present embodiment. As shown in the figure, the optical module 1 includes a light transmission processing unit 2, a light reception processing unit 3, and a light guide (light transmission path) 4.

The light transmission processing unit 2 has a configuration including a light emitting drive portion 5 and a light emitting portion (optical element) 6. The light emitting drive portion 5 drives the light emission of the light emitting portion 6 based on an electrical signal inputted from the outside. The light emitting drive portion 5 is configured by a light emission drive IC (Integrated Circuit). Although not shown in the figure, the light emitting drive portion 5 includes an electrical connecting part with respect to an electrical wiring for transmitting the electrical signal from the outside.

The light emitting portion 6 emits light based on a drive control by the light emitting drive portion 5. The light emitting portion 6 is configured by a light emitting element such as VCSEL (Vertical Cavity-Surface Emitting Laser). A light incident side end of the light guide 4 is irradiated with the light emitted from the light emitting portion 6 as a light signal. The IC may be configured on the outside.

The light reception processing unit 3 has a configuration including an amplifier 7 and a light receiving portion (optical element) 8. The light receiving portion 8 receives the light serving as a light signal exit from a light exit side end of the light guide 4, and outputs an electrical signal through photoelectric conversion. The light receiving portion 8 is configured by a light receiving element such as PD (Photo-Diode).

The amplifier 7 amplifies the electric signal outputted from the light receiving portion 8 and outputs the same to the outside. The amplifier 7 is configured by amplification IC, for example. Although not shown, the amplifier 7 includes an electrical connecting part with respect to the electrical wiring for transmitting the electrical signal to the outside.

The light guide 4 is a medium for transmitting the light exit from the light emitting portion 6 to the light receiving portion 8. The details of the configuration of the light guide 4 will be hereinafter described.

Figure 3:
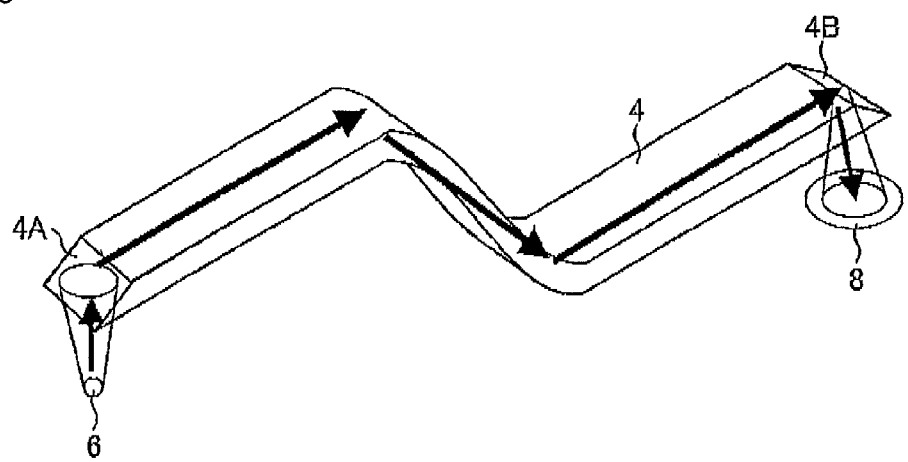
FIG. 3 is a view schematically showing a state of light transmission in a light transmission path.

FIG. 3 schematically shows the state of light transmission in the light guide 4. As shown in the figure, the light guide 4 is configured by a column-shaped member having flexibility. A light incident surface 4A is arranged at the light incident side end of the light guide 4, and a light exit surface 4B is arranged at the light exit side end.

The light exit from the light emitting portion 6 enters from a direction perpendicular to the light transmission direction of the light guide 4 with respect to the light incident side end of the light guide 4. The incident light advances through the light guide 4 by being reflected at the light incident surface 4A. The light that advances through the light guide 4 and reaches the light exit side end is reflected at the light exit surface 4B and exits in a direction perpendicular to the light transmission direction of the light guide 4. The light receiving portion 8 is irradiated with the exit light, and photoelectric conversion is performed in the light receiving portion 8.

According to such a configuration, the light emitting portion 6 serving as a light source can be arranged in a horizontal direction with respect to the light transmission direction with respect to the light guide 4. Thus, if the light guide 4 needs to be arranged parallel to the substrate surface, the light emitting portion 6 is installed between the light guide 4 and the substrate surface so as to emit light in the normal direction of the substrate surface. With such a configuration, the mounting becomes easier than the configuration of installing the light emitting portion 6 so as to emit light parallel to the substrate surface. Furthermore, application can be made to the configuration of using a plane mounting light emitting element in which the electrode and the light emitting portion are in the same plane.

The optical module 1 of the present embodiment has a configuration in which the signal light propagated through the light guide 4 is reflected by the light exit surface 4B and guided to the light receiving portion 8 (i.e., configuration of using the light exit surface 4B as the reflection surface for changing the optical path), but the configuration of the optical module 1 is not limited to such a configuration, and may be any configuration as long as the signal light exit from the light exit surface 4B can be received by the light receiving portion 8. For instance, the light guide 4 may have a configuration in which the light exit surface 4B does not function as the reflection surface, and the signal light may exit in the light transmission direction from the light exit surface 4B. In this case, the light receiving portion 8 is arranged such that the light receiving surface is in a direction perpendicular to the substrate surface (i.e., direction perpendicular to the light transmission direction) so as to receive the signal light exit in the light transmission direction from the light exit surface 4B.

Figure 1:
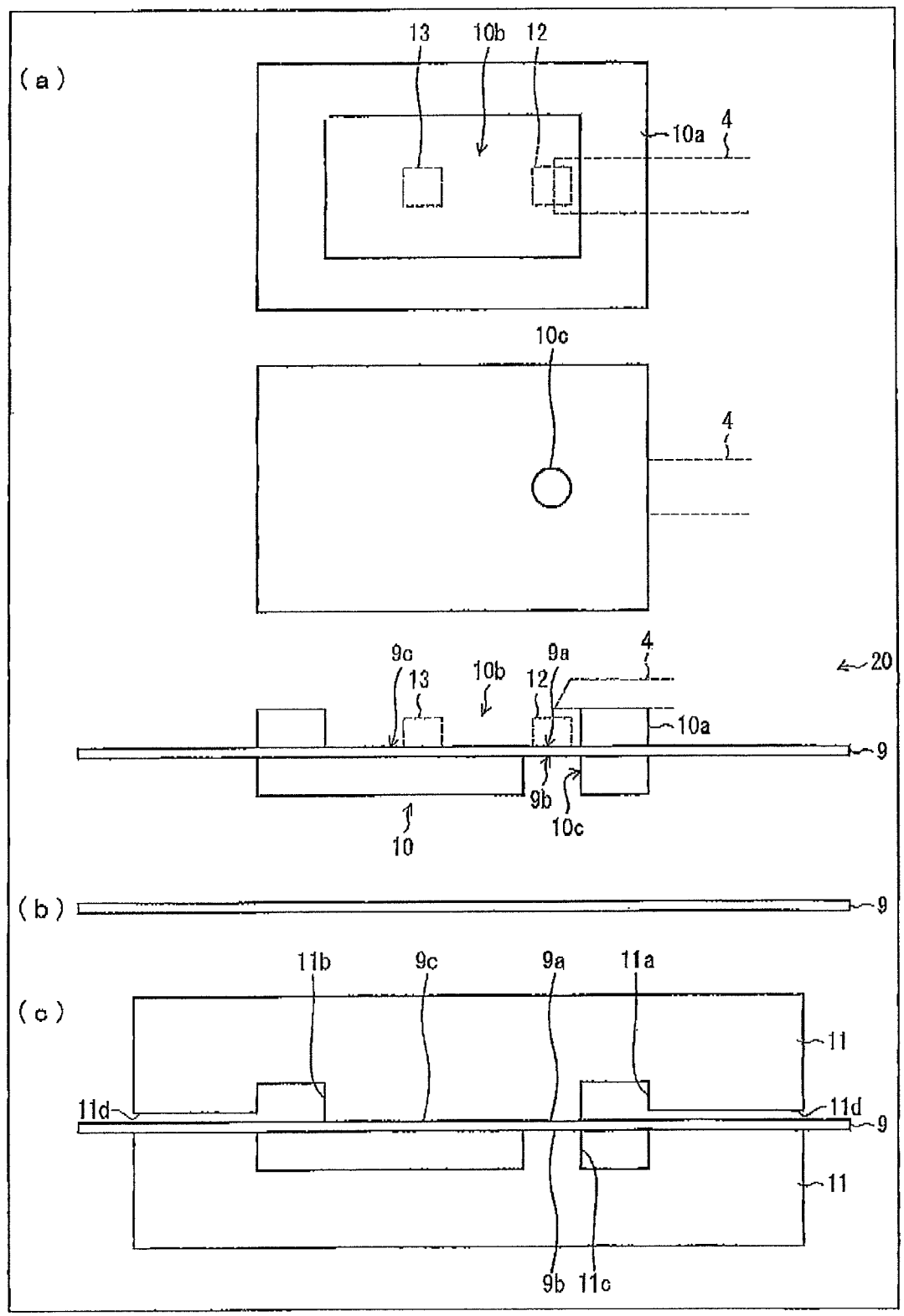
FIG. 1 (*a*) is a top view, bottom view, and cross-sectional view showing a schematic configuration of a package of one embodiment of the present invention, and (*b*) and (*c*) are cross-sectional views showing an outline of an method of manufacturing the package shown in (*a*).

The package of the present embodiment includes a supporting portion for supporting the light exit side end (or light incident side end) of the light guide 4, and an accommodating portion for accommodating the light emitting portion 6 or the light receiving portion 8 serving as the optical element, where a lead frame connecting to the optical element is interiorly arranged. The configuration and the manufacturing method of the package of the present embodiment will be described below based on FIGS. 1(a) to (c). Here, FIG. 1(a) shows a top view, bottom view, and cross-sectional view of the package of the present embodiment. Furthermore, FIGS. 1(b) and (c) are cross-sectional views showing an outline of the manufacturing method of the package of the present embodiment.

As shown in FIG. 1(a), a package 20 of the present embodiment has a lead frame 9 arranged in a resin unit 10. The resin unit 10 is formed with a supporting portion 10a for supporting the light guide 4, an accommodating portion 10b for accommodating an optical element 12 and a signal processing circuit 13 (correspond to light emitting drive portion 5 or amplifier 7 shown in FIG. 2), and an opening 10c.

The supporting portion 10a is formed adjacent to the accommodating portion 10b. In other words, the supporting portion 10a is formed as part of a side wall forming the accommodating portion 10b.

The lead frame 9 is exposed at the accommodating portion 10b. In the lead frame 9, an optical element mounting surface 9a for mounting the optical element, and a signal processing circuit mounting surface 9c for mounting the signal processing circuit are arranged. In FIG. 1(c), the side mounted with the optical element 12 is the upper side (front side), and the opposite side is the lower side (back side) in the lead frame 9.

In the package 20, a back surface 9c opposite to the optical element mounting surface 9a of the lead frame 9 is exposed. In other words, the opening 10c of the resin unit 10 is formed on the back side of the optical element mounting surface 9a in the lead frame 9, and the back surface 9c also serves as a surface on the upper side of the surfaces forming the opening 10c.

The package 20 has a characteristic in that the supporting portion 10a, the accommodating portion 10b, and the opening 10c of the resin unit 10 are integrally molded by a die. The manufacturing method of the package 20 will be described below.

The manufacturing method of the package 20 includes an integral molding step of integrally molding the resin unit 10 using an integral molding die 11 shown in FIG. 1(c). In the integral molding step, the lead frame 9 is prepared, as shown in FIG. 1(b). As shown in FIG. 1(c), the lead frame 9 is set in the die 11, and resin is injected from a resin injection port 11d of the die 11. After filling the resin into the die 11, the resin is cured and then the die 11 is detached to thereby manufacture the package 20.

The die 11 includes a recess 11a for forming the supporting portion 10a, a first projection 11b for forming the accommodating portion 10b, and a second projection 11c for forming the opening 10c. The first projection 11b comes into contact with the optical element mounting surface 9a of the lead frame 9, and the second projection 11c comes into contact with the back surface 9b opposite to the optical element mounting surface 9a. In other words, the first projection 11b and the second projection 11c form a sandwiching portion for sandwiching and holding both surfaces, the front surface and the back surface, of the optical element mounting portion of the lead frame 9.

In this manner, the die 11 sandwiches the optical element mounting portion when both surfaces, the optical element mounting surface 9a and the back surface 9b, come into contact with the first projection 11b and the second projection 11c, respectively. Accordingly, when the lead frame 9 is set in the die 11, the optical element mounting surface 9a of the lead frame 9 becomes a flat surface without warp etc. Therefore, the package 20 manufactured through integral molding by the die 11 can prevent the warp of the optical element mounting surface 9a at the lead frame. Therefore, in the package 20, the optical element mounting surface 9a and the upper surface of the supporting portion 10a are formed with satisfactory accuracy by the die, and the positional accuracy required to maintain the positional relationship of the flexible light guide end and the optical element constant can be satisfied. In the package 20, the positional relationship of the flexible light guide end and the optical element can be maintained at the positional accuracy of 5 μm, for example.

In the manufacturing method of the package 20, the resin to be filled in the die 11 is not particularly limited as long it is a resin used in general integral molding. The resin to be filled in the die 11 may be liquid polymer (LCP), epoxy resin, and the like.

In FIG. 1(c), a die where both surfaces of the optical element mounting surface 9a and the back surface 9b come into contact with the first projection 11b and the second projection 11c, respectively, so that the optical element mounting portion is sandwiched is used for the die 11. Not limited thereto, a die that sandwiches the signal processing circuit mounting surface 9c and the back surface opposite thereto in addition to the optical element mounting portion may be used. Therefore, the positional accuracy required to maintain the positional relationship of the flexible light guide end and the optical element constant is satisfied, and the signal processing circuit can be stably mounted on the accommodating portion 10b.

(Configuration of Light Guide Capable of being Mounted on the Package 20)

Figure 4:
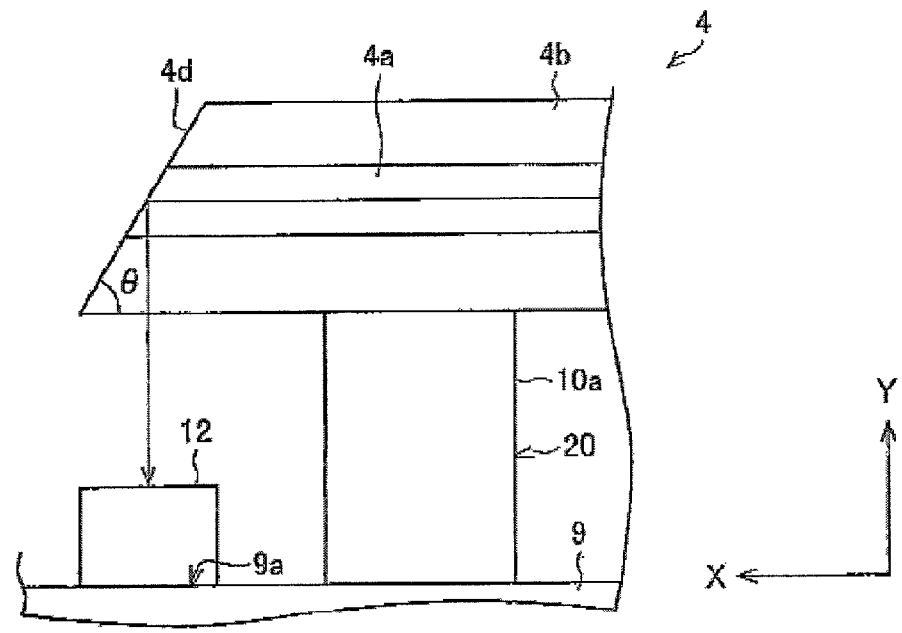
FIG. 4 is a cross-sectional view showing a light transmission path that can be mounted in a package.

FIG. 4 shows a cross-sectional view of the light guide 4 that can be mounted in the package 20. As shown in the figure, the light guide 4 has a configuration including a column-shaped core 4a having the light transmission direction as the axis, and a clad 4b arranged to surround the periphery of the core 4a. The core 4a and the clad 4b are made of material having translucency, and the index of refraction of the core 4a is higher than the index of refraction of the clad 4b. The light signal that entered the core 4a is transmitted in the light transmission direction by repeating total reflection inside the core 4a. In FIG. 4, the longitudinal direction (optical axis direction) of the light guide 4 is an X-axis direction, and the normal direction of the optical element mounting surface 9a in the lead frame 9 is a Y-axis direction at the vicinity of the end of the light guide 4.

Glass, plastic, and the like can be used for the material for forming the core 4a and the clad 4b, but a flexible material having an elasticity of lower than or equal to 1000 MPa is preferable to configure the light guide 4 having sufficient flexibility. The material for configuring the light guide 4 includes resin material such as acryl series, epoxy series, urethane series, and silicone series. The clad 4b may be configured by gas such as air. Furthermore, similar effects are obtained by using the clad 4b under a liquid atmosphere having a smaller index of refraction than the core 4a. The light guide 4 is not particularly limited as long as the signal light can be propagated, and may be an optical fiber, or a (film) light guide.

The end face at the light guide 4 is not perpendicular to the optical axis (X-axis), and is cut diagonally to thereby form the optical path changing mirror surface 4d. Specifically, the end face of the light guide 4 is perpendicular to the XY plane and is inclined so as to form an angle θ (θ<90° with respect to the X-axis.

With this configuration, on the light exit side of the light guide 4, the signal light transmitting through the core 4a is reflected by the optical path changing mirror surface 10D so that the advancing direction is changed, and exit from the optical path changing mirror surface 4d towards the optical element 12. The light receiving surface (or light emitting surface) of the optical element 12 is arranged facing the light exit surface (or incident surface) of the light guide 4.

The inclined angle θ of the optical path changing mirror surface 4d is normally set to 45° so that the alignment of the optical path changing mirror surface 4d and the optical element 12 is facilitated. The optical path changing mirror may be obtained by externally attaching a mirror to the end of the light guide 4.

(Second Variant)

Figure 5:
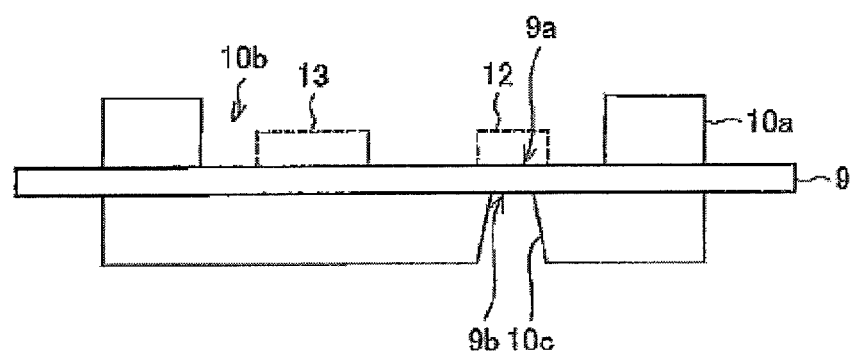
FIG. 5 is a cross-sectional view showing the configuration of the main parts of a package serving as another variant.

In the configuration of the package 20 of the present embodiment, another variant of the configuration shown in FIG. 1(c) will be described. FIG. 5 shows a cross-sectional view taken along a plane perpendicular to the light transmission direction of the package 20 serving as a second variant. In the configuration shown in FIG. 1(c), the areas of the optical element mounting surface 9a and the back surface 9b thereof of the lead frame 9 are substantially the same, but the area of the back surface 9b may be smaller than the area of the optical element mounting surface 9a, as shown in FIG. 5.

Specifically, as shown in FIG. 5, the back surface 9b corresponding to the surface on the upper side of the surfaces forming the opening 10c has a smaller area than the optical element mounting surface 9a. The opening 10c has a configuration in which the interval between the side walls forming the opening 10c becomes greater towards the lower side from the back surface 9c.

The package 20 of the second variant can be manufactured using the die 11 in which the contacting area with the back surface 9b of the second projection 11c is smaller than the contacting area with the optical element mounting surface 9a of the first projection 11b in the integral molding step shown in FIG. 1(c). The opening 10c shown in FIG. 5 is manufactured through integral molding by using the die 11 in which the second projection 11c has a tapered shape which outer periphery becomes larger towards the lower side.

The close attachment force of the first projection 11b and the optical element mounting surface 9a increases and the optical element mounting surface 9a in the lead frame 9 can be reliably held by integrally molding with the contacting area of the back surface 9b and the second projection 11c reduced.

(Third Variant)

Figure 6:
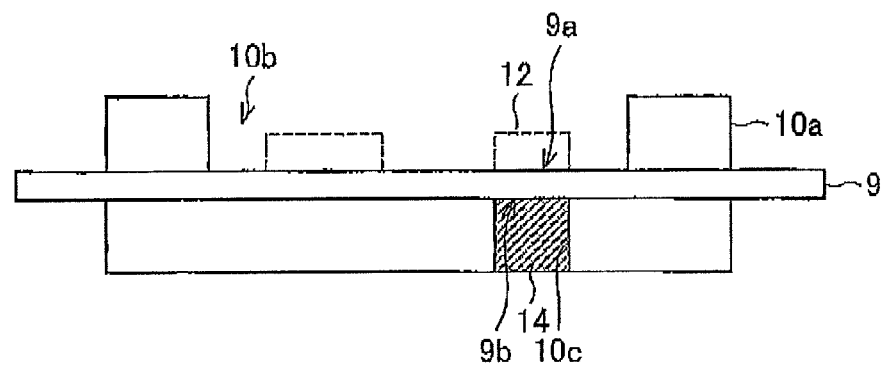
FIG. 6 is a cross-sectional view showing the configuration of the main parts of a package serving as still another variant.

In the configuration of the package 20 of the present embodiment, still another variant of the configuration shown in FIG. 1(c) will be described. FIG. 6 shows a cross-sectional view taken along a plane perpendicular to the light transmission direction of the package 20 serving as the third variant. In the configuration shown in FIG. 1(c), the back surface of the lead frame 9 is exposed at the opening 10c, but resin (resin filled portion 14) may be filled in the opening 10c, as shown in FIG. 6.

The back surface 9b of the lead frame 9 thus is not exposed to the outside and can be protected from static electricity at outside the optical module by filling resin in the opening 10c. Furthermore, corrosion of the back surface 9b of the lead frame 9 can be prevented.

The package 20 shown in FIG. 6 can be manufactured by performing a resin filling step of filling resin in the opening 10c on the back side of the optical element mounting surface 9a formed by the second projection 11c after the integral molding step.

The resin used in the resin filling step (resin forming resin filled portion 14) is not particularly limited as long as it is resin that can prevent the exposure of the back surface 9b of the lead frame 9. The resin used in the resin filling step may be the same resin as the resin used in the integral molding step (resin forming resin unit 10), or may be a different resin.

(Fourth Variant)

Figure 7:
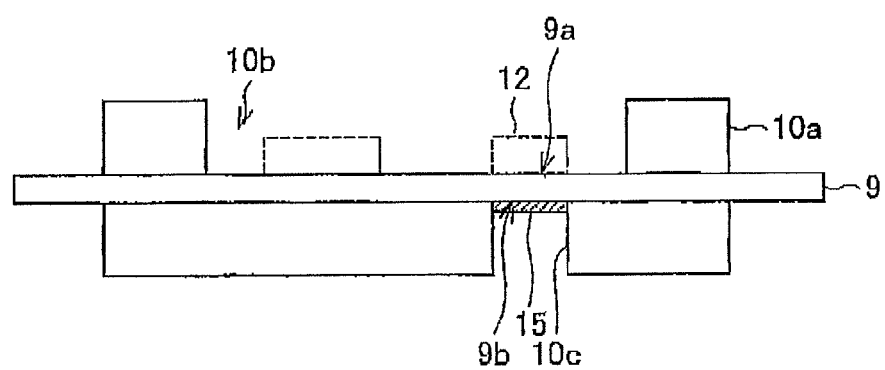
FIG. 7 is a cross-sectional view showing the configuration of the main parts of a package serving as yet another variant.

In the configuration of the package 20 of the present embodiment, yet another variant of the configuration shown in FIG. 1(c) will be described. FIG. 7 shows a cross-sectional view taken along a plane perpendicular to the light transmission direction of the package 20 serving as a fourth variant. In the configuration shown in FIG. 1(c), the back surface of the lead frame 9 is exposed at the opening 10c, but the surface (back surface 9b) on the upper side of the opening 10c may be subjected to plating process (plating portion 15), as shown in FIG. 7.

In this manner, the back surface 9b of the lead frame 9 is not exposed to the outside and the corrosion of the back surface 9b of the lead frame 9 can be prevented by adopting the configuration in which the plating process is performed on the surface (back surface 9b) on the upper side of the opening 10c.

The opening 10c formed with the plating portion 15 may be used as a test terminal for testing an operation check etc. of the optical element such as VCSEL and PD. Thus, an extra terminal does not need to be set as the test terminal at the exterior of the package 20, and the step can be simplified. Furthermore, the back surface 9b of the lead frame 9 can be easily protected by filing the opening 10c with resin and the like after the test by the test terminal.

(Application Example)

The optical module 1 of the present embodiment can be applied to the following application examples.

First, as a first application example, use can be made at a hinge portion in a foldable electronic device such as a foldable portable telephone, a foldable PHS (Personal Handyphone System), a foldable PDA (Personal Digital Assistant), and a foldable notebook computer.

Figure 8:
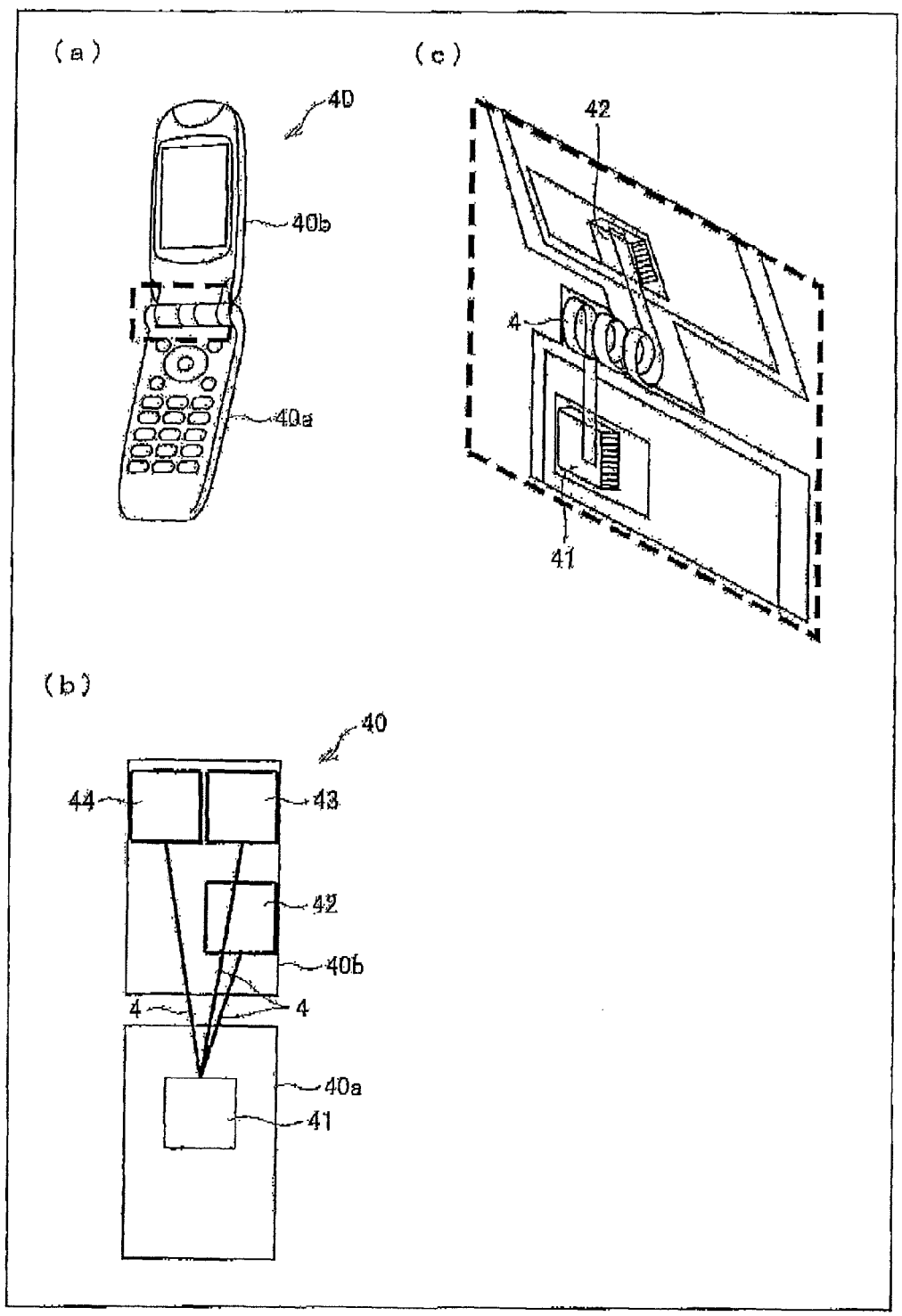
FIG. 8(*a*) is a perspective view showing an outer appearance of a foldable portable telephone including the light guide according to the present embodiment, (*b*) is a block diagram of a portion where the light guide is applied in the foldable portable telephone shown in (*a*), and (*c*) is a perspective plan view of a hinge portion in the foldable portable telephone shown in (*a*).

FIGS. 8 (a) to (c) show an example in which the light guide 4 is applied to a foldable portable telephone 40. In other words, FIG. 8(a) is a perspective view showing an outer appearance of the foldable portable telephone 40 incorporating the light guide 4.

FIG. 8(b) is a block diagram of a portion where the light guide 4 is applied in the foldable portable telephone 40 shown in FIG. 8(a). As shown in the figure, a control unit 41 arranged on a body 40a side in the foldable portable telephone 40, an external memory 42, a camera (digital camera) 43, and a display unit (liquid crystal display) 44 arranged on a lid (drive portion) 40b side rotatably arranged at one end of the body with the hinge portion as a shaft are connected by the light guide 4.

FIG. 8(c) is a perspective plan view of the hinge portion (portion surrounded with a broken line) in FIG. 8(a). As shown in the figure, the light guide 4 is wrapped around a supporting rod at the hinge portion and bent to thereby connect the control unit arranged on the body side, and the external memory 42, the camera 43, and the display unit 44 arranged on the lid side.

High speed and large capacity communication can be realized in a limited space by applying the light guide 4 to the foldable electronic device. Therefore, it is particularly suitable in devices where high speed and large capacity data communication is necessary and miniaturization is demanded such as the foldable liquid crystal display.

As a second application example, the light guide 4 is applied to a device having a drive portion such as a printer head in a printing device (electronic device) and a reading unit in a hard disk recording and reproducing device.

Figure 9:
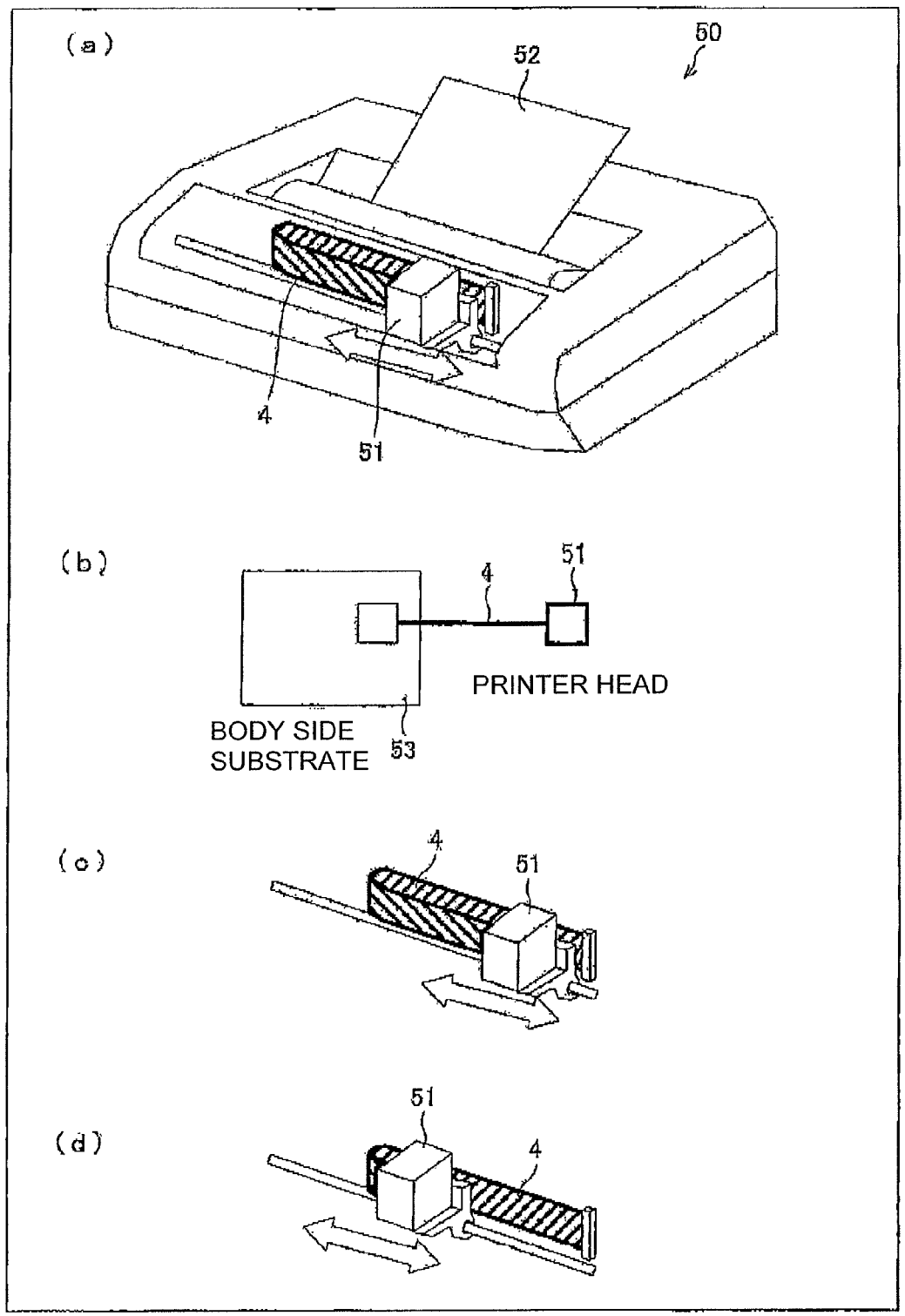
FIG. 9(*a*) is a perspective view showing an outer appearance of a printing device including the light guide according to the present embodiment, (*b*) is a block diagram showing the main parts of the printing device shown in (*a*), and (*c*) and (*d*) are perspective views showing a curved state of the light guide when the printer head is moved (driven) in the printing device.

FIGS. 9(a) to (c) show an example in which the light guide 4 is applied to a printing device 50. FIG. 9(a) is a perspective view showing an outer appearance of the printing device 50. As shown in FIG. 9(a), the printing device 50 includes a printer head 51 for performing printing on a paper 52 while moving in a width direction of a paper 52, where one end of the light guide 4 is connected to the printer head 51.

FIG. 9(b) is a block diagram of a portion where the light guide 4 is applied in the printing device 50. As shown in the figure, one end of the light guide 4 is connected to the printer head 51, and the other end is connected to a body side substrate in the printing device 50. The body side substrate includes control means etc. for controlling the operation of each unit of the printing device 50, and the like.

FIG. 9(c) and FIG. 9(d) are perspective views showing a curved state of the light guide 4 when the printer head 51 is moved (driven) in the printing device 50. As shown in the figures, when the light guide 4 is applied to the drive portion such as the printer head 51, the curved state of the light guide 4 changes by the drive of the printer head 51 and each position of the light guide 4 repeatedly curves.

Therefore, the optical module 1 according to the present embodiment is suited for such a drive portion. High speed and large capacity communication using the drive portion can be realized by applying the optical module 1 to such drive portions.

Figure 10:
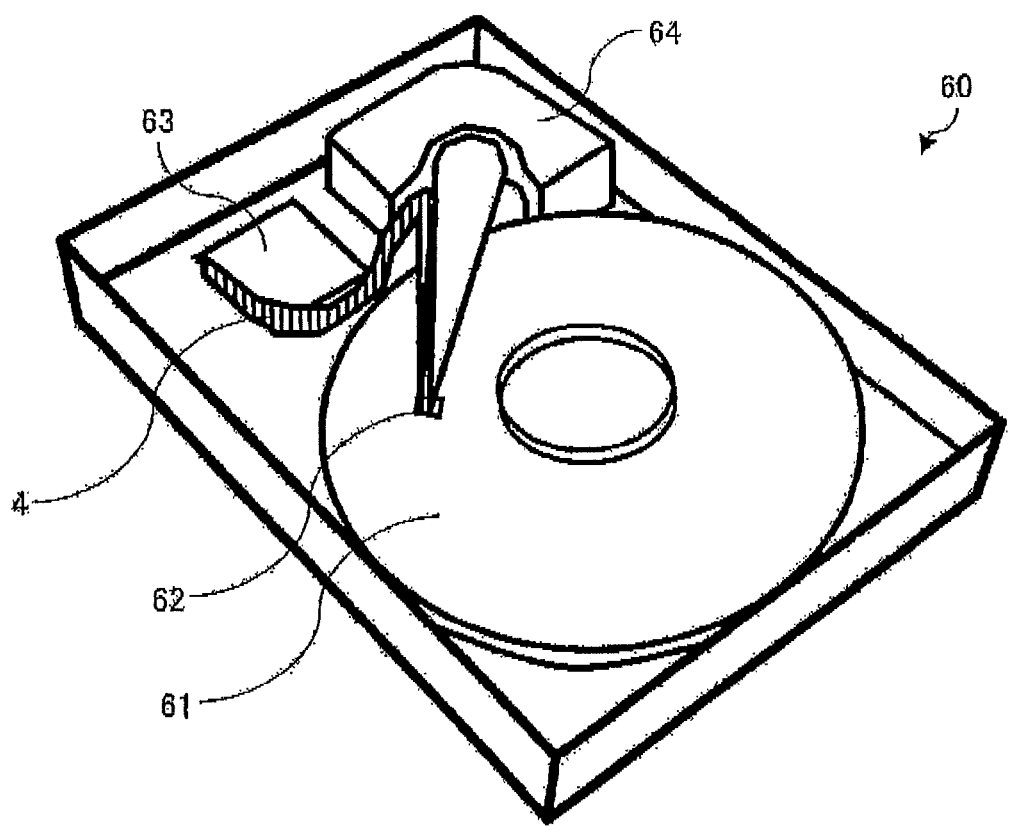
FIG. 10 is a perspective view showing an outer appearance of a hard disk recording and reproducing device including the light guide according to the present embodiment.

FIG. 10 shows an example in which the light guide 4 is applied to a hard disk recording and reproducing device 60.

As shown in the figure, the hard disk recording and reproducing device 60 includes a disk (hard disk) 61, a head (read/write head) 62, a substrate introducing portion 63, a drive portion (drive motor) 64, and the light guide 4.

The drive portion 64 drives the head 62 along a radial direction of the disk 61. The head 62 reads the information recorded on the disk 61 and writes information on the disk 61. The head 62 is connected to the substrate introducing portion 63 by way of the light guide 4, and propagates the information read from the disk 61 to the substrate introducing portion 63 as a light signal and receives the light signal of the information to write to the disk 61 propagated from the substrate introducing portion 63.

Therefore, high speed and large capacity communication can be realized by applying the light guide 4 to the drive portion such as the head 62 in the hard disk recording and reproducing device 60.

The present invention is not limited to the above-described embodiments, and various modifications may be made within the scope of the Claims. In other words, the embodiments obtained by combining the technical means appropriately modified within the scope of the Claims are encompassed in the technical scope of the present invention.

The manufacturing method of the package according to the present invention includes an integral molding step of setting a lead frame in a die including a recess for forming the supporting portion, a first projection that comes into contact with the optical element mounting surface in the lead frame, and a second projection that comes into contact with the back surface of the optical element mounting surface, filling resin in the die, and integrally molding a package, as described above.

The package according to the present invention has a configuration manufactured through the manufacturing method of the package, as described above.

The optical module according to the present invention has a configuration in which the optical element and the light transmission path are mounted on the package, as described above.

The integral molding die according to the present invention includes a recess for forming the supporting portion, a first projection that comes into contact with the optical element mounting surface in the lead frame and a second projection that comes into contact with the back surface of the optical element mounting surface, as described above.

Thus, a package that can satisfy the positional accuracy required to maintain the positional relationship of the flexible light transmission path end and the optical element constant can be realized.

The manufacturing method of the package according to the present invention preferably uses a die in which the contacting area with the back surface of the second projection is smaller than the contacting area with the optical element mounting surface of the first projection in the integral molding step.

In the above-described configuration, since the die in which the contacting area with the back surface of the second projection is smaller than the contacting area with the optical element mounting surface of the first projection is used, the close attachment force of the first projection and the optical element mounting surface increases and the optical element mounting surface in the lead frame can be reliably held. The shape of the second projection is not particularly limited to a circular column shape, and may be other shapes such as circular cone shape, polygonal column shape, and polygonal spindle shape.

The manufacturing method of the package according to the present invention may use a die in which the second projection has a tapered shape in the integral molding step.

The manufacturing method of the package according to the present invention preferably includes a resin filling step of filling the opening on the back side of the optical element mounting surface formed by the second projection with resin after the integral molding step.

Thus, the back surface of the lead frame is not exposed to the outside, and is protected from static electricity at outside the optical module. Furthermore, the corrosion of the back surface of the lead frame can be prevented.

The manufacturing method of the package according to the present invention preferably includes a plating step of performing a plating process on the opening on the back side of the optical element mounting surface formed by the second projection after the integral molding step.

Thus, the back surface of the lead frame is not exposed to the outside, and the corrosion of the back surface of the lead frame can be prevented.

In the optical module according to the present invention, the opening is preferably a test terminal.

Thus, an extra terminal does not need to be set as the test terminal at the exterior of the package, and the step can be simplified.

Specific embodiments or examples described in the Best mode for carrying out the invention merely clarify the technical content of the present invention and should not be construed in a narrow sense limiting to only such specific examples, where the embodiments obtained by appropriately combining the technical means described in different embodiments within the spirit of the present invention and the scope of the Claims are also encompassed in the technical scope of the present invention.

INDUSTRIAL APPLICABILITY

The optical module according to the present invention is applicable to the light communication path between various types of devices, and is also applicable to a flexible optical wiring serving as an in-device wiring mounted in a small and thin consumer device.

The invention claimed is:

1. The manufacturing method of a package including a supporting portion for supporting at least one end including an incident/exit port of a light signal in a light transmission path and a lead frame for mounting an optical element; the manufacturing method comprising:
an integral molding step of setting the lead frame in a die including a recess for forming the supporting portion, a first projection, which comes into contact with an optical element mounting surface of the lead frame, and a second projection, which comes into contact with a back surface of the optical element mounting surface, filling resin to the die, and integrally molding the package,
wherein a die in which a contacting area with the back surface of the second projection is smaller than a contacting area with the optical element mounting surface of the first projection is used in the integral molding step.

2. The manufacturing method of a package according to claim 1, wherein a die in which the second projection has a tapered shape is used in the integral molding step.

3. The manufacturing method of a package according to claim 1, comprising a resin filling step of filling an opening on the back side of the optical element mounting surface formed by the second projection with resin after the integral molding step.

4. The manufacturing method of a package including a supporting portion for supporting at least one end including an incident/exit port of a light signal in a light transmission path and a lead frame for mounting an optical element; the manufacturing method comprising:
an integral molding step of setting the lead frame in a die including a recess for forming the supporting portion, a first projection, which comes into contact with an optical element mounting surface of the lead frame, and a second projection, which comes into contact with a back surface of the optical element mounting surface, filling resin to the die, and integrally molding the package; and
a plating step of performing a plating process on the opening on the back side of the optical element mounting surface formed by the second projection after the integral molding step.

5. A package manufactured through a manufacturing method of a package according to claim 1.

6. An optical module, wherein an optical element and a light transmission path are mounted on a package according to claim 5.

7. The optical module according to claim 6, wherein the opening is a test terminal.

8. An integrally molding die for manufacturing a package including a supporting portion for supporting at least one end including an incident/exit port of a light signal in a light transmission path and a lead frame for mounting an optical element; the integrally molding die comprising:
a recess for forming the supporting portion, a first projection, which comes into contact with an optical element mounting surface of the lead frame, and a second projection, which comes into contact with a back surface of the optical element mounting surface,
wherein a die in which a contacting area with the back surface of the second projection is smaller than a contacting area with the optical element mounting surface of the first projection is used in the integral molding step.

* * * * *